(12) United States Patent
Gardes et al.

(10) Patent No.: US 7,591,958 B2
(45) Date of Patent: Sep. 22, 2009

(54) THIN GLASS CHIP FOR AN ELECTRONIC COMPONENT AND MANUFACTURING METHOD

(75) Inventors: Pascal Gardes, Tours (FR); Fabrice Guitton, Monnaie (FR)

(73) Assignee: STMicroelectronics SA, Montrouge (FR)

( * ) Notice: Subject to any disclaimer, the term of this patent is extended or adjusted under 35 U.S.C. 154(b) by 285 days.

(21) Appl. No.: 11/213,098

(22) Filed: Aug. 26, 2005

(65) Prior Publication Data

US 2006/0057782 A1    Mar. 16, 2006

(30) Foreign Application Priority Data

Sep. 14, 2004   (FR) .................................. 04 52039

(51) Int. Cl.
*B44C 1/22* (2006.01)
(52) U.S. Cl. ............... 216/79; 216/80; 216/99
(58) Field of Classification Search ............... 216/75, 216/97, 99, 79, 80; 438/458, 462
See application file for complete search history.

(56) References Cited

U.S. PATENT DOCUMENTS

| | | | | |
|---|---|---|---|---|
| 3,457,123 A | * | 7/1969 | Pul | ............... 438/406 |
| 4,794,092 A | * | 12/1988 | Solomon | ............... 438/109 |
| 5,698,485 A | | 12/1997 | Brueck et al. | |
| 5,883,310 A | * | 3/1999 | Ho et al. | ............... 73/766 |
| 6,607,970 B1 | * | 8/2003 | Wakabayashi | ............... 438/462 |
| 7,146,016 B2 | * | 12/2006 | Pedersen | ............... 381/175 |
| 2002/0076575 A1 | | 6/2002 | Yang et al. | |

OTHER PUBLICATIONS

French Search Report, FR0452039, May 20, 2005.
Merz, P., et al., A Novel Micromachining Technology for Structuring Borosilicate Glass Substrates, XP010646518, Transducers '03, IEEE vol. 1, pp. 258-261, Jun. 2003.
Use of High Precision Silicon Molds for Replicating Microelectronic Packaging Structures, XP002156789, IBM Corp., vol. 30, No. 5, pp. 306-311, Oct. 1987.

* cited by examiner

*Primary Examiner*—Lah Vinh
(74) *Attorney, Agent, or Firm*—Lisa K. Jorgensen; Paul F. Rusyn; Graybeal Jackson LLP

(57) ABSTRACT

The manufacturing of electronic components on individual substrates made of an insulating material includes molding, in a silicon wafer, an insulating material with a thickness corresponding to the final thickness desired for the substrates, manufacturing the electronic components, and removing the silicon from the rear surface of the wafer after manufacturing of the components.

14 Claims, 4 Drawing Sheets

THIN GLASS CHIP FOR AN ELECTRONIC COMPONENT AND MANUFACTURING METHOD

PRIORITY CLAIM

This application claims priority from French patent application No. 04/52039, filed Sep. 14, 2004, which is incorporated herein by reference.

BACKGROUND OF THE INVENTION

1. Field of the Invention

Embodiments of the present invention relate to the manufacturing of electronic components on wafers used as a substrate and, more specifically, to so-called single face products, that is, having their components supported by a single surface of the wafer.

Embodiments of the present invention more specifically apply to the manufacturing of passive components on glass substrates.

2. Discussion of the Related Art

The search for component miniaturization goes along with a need to reduce the thickness of the wafers or substrates supporting these components. The small thickness desired for the final components is, however, incompatible with the stress undergone by the wafers during manufacturing, and the final thickness of the individual substrate of the component is accordingly achieved at the end of the process.

An example is the forming of passive components on glass substrates wherein the components are formed on one surface, arbitrarily called the front surface, of a relatively thick glass wafer (more than 500 micrometers). Then, the wafer is grinded on its rear surface deprived of any component to reach the final thickness desired for individual substrates (200 micrometers, or even less).

At the end of the thickness reduction, the wafer considerably loses its mechanical strength. Now, the handlings required in subsequent steps, among others of cleaning and washing, resulting in risks of cracks or breaks of the structures of the component formed at the front surface.

It should be noted that this risk of breakage of the structure is already present in the rectification step, due to the irregular bearing of the front surface which supports the components. The unevenness of the front surface typically is on the order of some twenty micrometers (thickness variation of the front surface at the end of the component manufacturing). The irregular bearing resulting therefrom, associated with the pressure applied by the grinding wheel on the rear surface, causes breakage risks, especially at the end of the rectification step when the wafer becomes thinner and thinner and this thickness difference is no longer negligible as compared with the general wafer thickness. This is especially why the final thicknesses of the wafers, rectified at their rear surface after manufacturing of the components, are generally no smaller than 200 μm.

Another disadvantage is linked to a deformation of the wafer which becomes slightly bulged (warp) when it is thin. This deformation especially results from the presence of the components on a single surface. This curvature may impede the wafers from being housed in batch processing baskets. As an example, with a deflection reaching 3.2 mm, the introduction of the thin wafers in usual handling baskets is no longer possible.

SUMMARY OF THE INVENTION

An embodiment of the present invention aims at suppressing the risk entailed by the handling of thin wafers, especially made of glass, at the end of a manufacturing process of electronic components and more specifically of components formed on a single surface with thick or stressful processings likely to generate surface evenness defects of the wafer.

An embodiment of the present invention also aims at providing a solution enabling achieving thinner final thicknesses with no wafer breakage risk. Another embodiment of the present invention especially aims at achieving thicknesses smaller than 100 μm.

Another embodiment of the present invention also aims at providing a solution which is particularly well adapted to glass substrates.

A further embodiment of the present invention also aims at a solution more specifically adapted to the manufacturing of passive component on glass substrates.

According to another embodiment, the present invention provides a method for manufacturing electronic components on individual substrates made of an insulating material. The method includes:

molding, in a silicon wafer, an insulating material with a thickness corresponding to the final thickness desired for said substrates;

manufacturing the electronic components; and removing the silicon from the rear surface of the wafer after manufacturing of said components.

According to an embodiment of the present invention, the front surface of the silicon wafer is etched to receive the insulating material by molding, according to a disk pattern intended to support several components, a step of cutting the insulating material being performed after removal of the rear surface silicon.

According to an embodiment of the present invention, the front surface of the silicon wafer is etched to receive the insulating material by molding, according to patterns corresponding to the patterns of the individual substrates of the components to be formed.

According to an embodiment of the present invention, the silicon remaining between the etch patterns defines subsequent cutting paths.

According to an embodiment of the present invention, the components are individualized by chemical etch of all the silicon at the end of the component manufacturing.

According to an embodiment of the present invention, the thickness of the insulating material embedded in the silicon wafer is smaller than 100 μm.

According to an embodiment of the present invention, the insulating material is glass.

An embodiment of the present invention also provides an electronic component formed on an insulating substrate.

According to an embodiment of the present invention, the peripheral surface of the insulating substrate exhibits an irregular state, with no splinters.

According to an embodiment of the present invention, the component comprises several passive elements.

The foregoing and other features and advantages of the present invention will be discussed in detail in the following

DETAILED DESCRIPTION

Figure 1A:
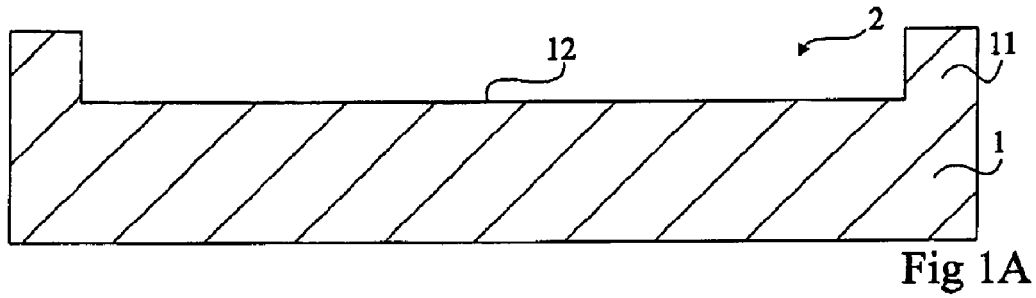
FIGS. 1A TO 1G very schematically illustrate in cross-sectional views a method for manufacturing components supported by glass substrates according to a first embodiment of the present invention.

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Same elements have been designated with the same reference numerals in the different drawings, which have been drawn out of scale. For clarity, only those method steps which are necessary to the understanding of embodiments of the present invention have been shown in the drawings and will be described hereafter. In particular, the actual manufacturing steps of the components formed on the front surface of a wafer processed by embodiments of the present invention (layer deposition, pattern definition, etches, etc.) have not been detailed, embodiments of the present invention being compatible with conventional steps of manufacturing of electronic components, especially of passive components.

FIGS. 1A TO 1G illustrate, in simplified cross-sectional views, a method for manufacturing passive components on insulating substrates, preferably made of glass, according to a first embodiment of the present invention.

Figure 2A:
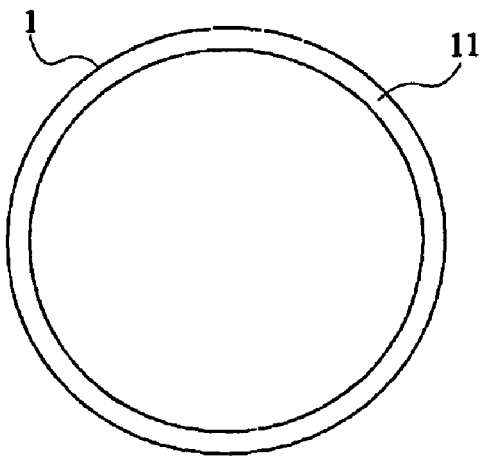
FIGS. 2A AND 2B are simplified top views of a wafer at the end of the steps illustrated in FIGS. 1A TO 1G.

It is started from a silicon wafer 1 (or another material currently used as a substrate in the electronic industry, preferably of low cost). An etch, preferably circular, is performed in wafer 1, to obtain a peripheral silicon wall 11 surrounding the disk-shaped bottom 12 of the performed etch. FIG. 2A shows a top view of this structure.

According to an embodiment of the present invention, the depth of the obtained cavity 2 is selected to correspond (at least approximately) to the final thickness desired for the glass substrates intended to support the components formed at the front surface. For example, the etch depth ranges between 20 and 100 μm while the total thickness of wafer 1 is initially greater than the etched depth (for example, 500 μm).

The function of wafer 1 is, according to embodiments of the present invention, to provide the mechanical stiffness necessary to the handlings of the assembly during component manufacturing steps. Its thickness is not critical since it is only used as a support.

In a second step (FIG. 1B), cavity 2 is filled with glass 5. For example, this filling is obtained by laying a glass wafer on silicon wafer 1 and by melting this glass wafer, to fill the pattern etched in wafer 1. According to another example, the filling is performed with glass powder with or without a binder.

According to another embodiment, the filling material is not glass, but another insulating material. Any insulating material is appropriate, provided that it is capable of filling the cavity and of forming a substrate for the components.

In a third step (FIG. 1C), a rectification of the front surface of the wafer is performed to obtain a planar surface adapted to the subsequent manufacturing of the components. This rectification is, for example, performed to reach the top of peripheral silicon wall 11. As an alternative, the grinding may slightly etch this wall.

Figure 1B:
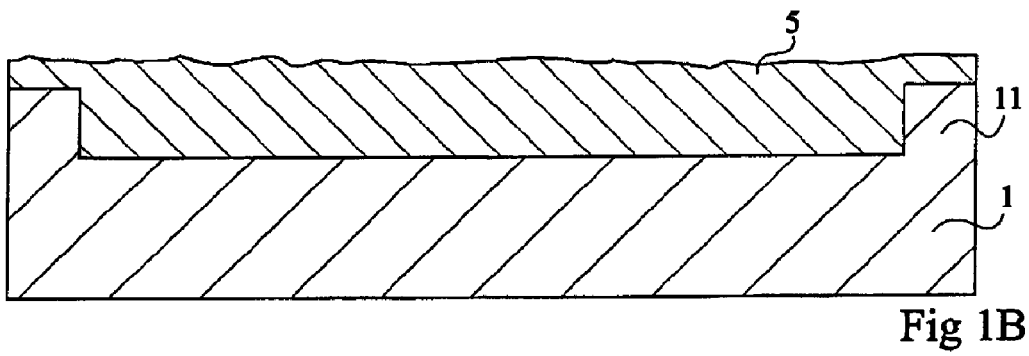
Figure 1C:
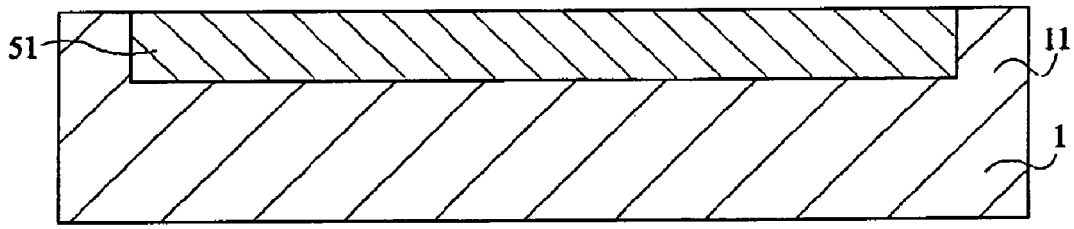

The structure resulting from the step shown in FIG. 1C is that used as a base for the component manufacturing on the front surface of the wafer. This structure is formed of a glass substrate 51 embedded in silicon wafer 1.

All the component-manufacturing steps are carried out by conventional methods. In particular, embodiments of the present invention are compatible with temperatures currently used to form components on a glass wafer.

Figure 1D:
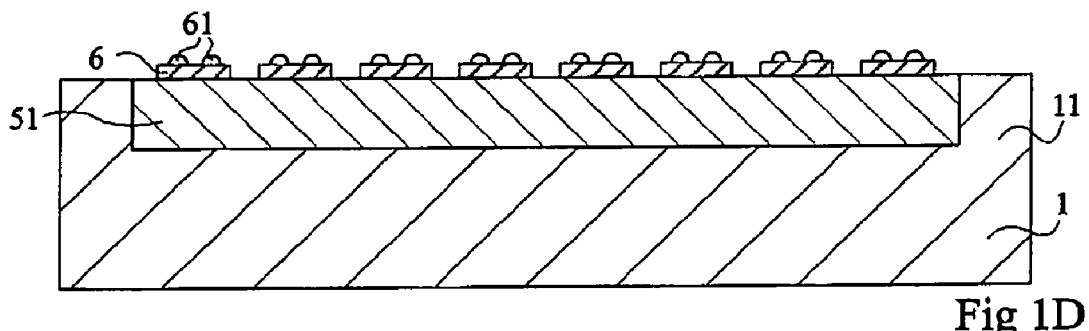
Figure 1E:
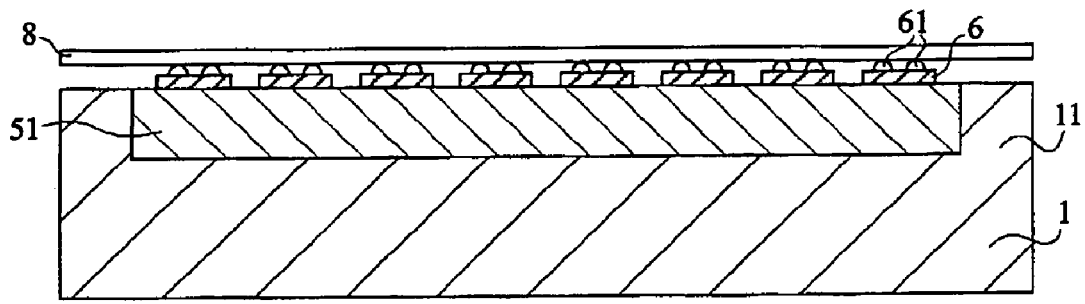
Figure 1F:
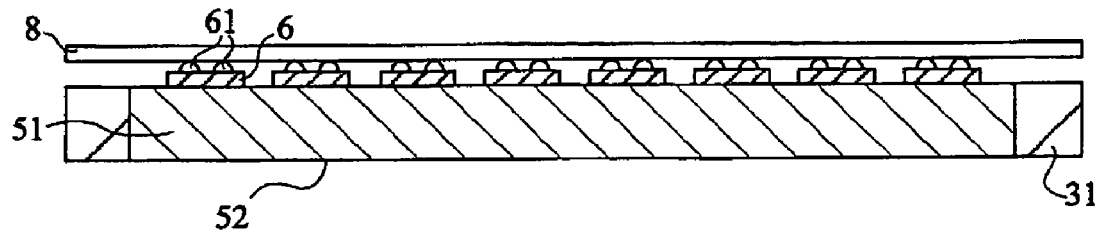
Figure 1G:
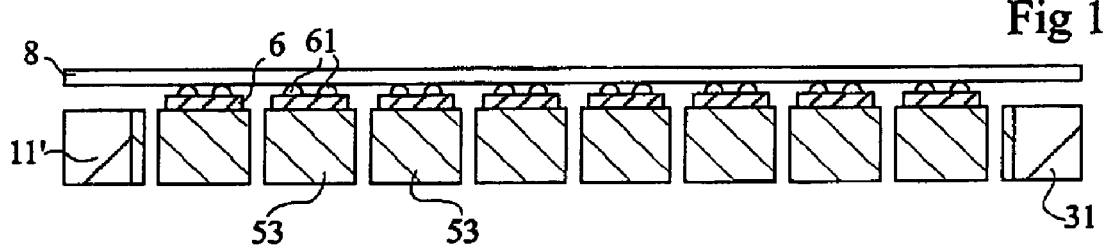

A wafer on which have been formed components 6 distributed on glass substrate 51, still embedded in silicon wafer 1, is then obtained (FIG. 1D). Preferably, the manufacturing of components 6 is carried out until conductive bosses 61 or the like, which will be used afterwards to connect component(s) 6 on a printed circuit or the like, are formed. The number of individual components (resistor, inductance, capacitor) formed on a same chip depends on the application and the number of bosses also depends on the application (on the connection needs of the formed component(s)).

According to an embodiment of the present invention, a protection disk 8 is placed on the front surface of the wafer (FIG. 1E), which is for example glued on the front surface of the structure. The use of component protection disks is conventional per se.

The rear surface of wafer 1 is then thinned down (FIG. 1F) to eliminate the silicon support. This thickness decrease from the rear surface is performed until a rear surface 52 of glass disk 51 is reached.

Different thickness reduction methods may be used. For example, the silicon may be etched by plasma, by grinding, or by a wet etch method, provided that the etching does not reach the components formed on the front surface. The front surface may be protected by an adapted layer (for example, made of resin) deposited before the laying of the protection disk 8 and before etching of the rear surface.

Among the preferred etch materials, the possible use of NH$_4$OH, which has the advantage of not etching the passive components formed on the glass, should be noted.

Then (FIG. 1G), the components are individualized by a cutting of glass disk 51 from its rear surface 52. As an alternative, disk 51 is transferred onto a rear surface protection disk, after which the front surface protection disk is removed to perform a cutting from the front surface. The cutting of a glass wafer is conventional per se. The individual components supported by respective glass substrates 53, which then only remain to be separated from protection disk 8, are obtained.

Figure 2B:
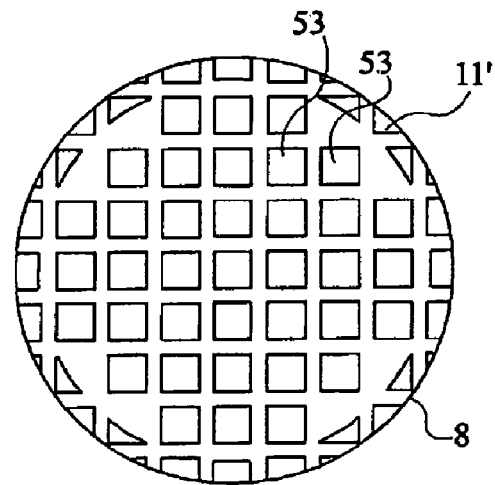

FIG. 2B illustrates a bottom view of the structure obtained at the end of the cutting step. In FIG. 2B, it has been assumed that residues 11' of the peripheral silicon wall remain attached to disk 8.

To separate protection disk 8, another disk (not shown) is arranged (for example by gluing) on the rear surface to hold, on separation of front surface protection disk 8, the formed components. Disk 8 does not necessarily have a strong adherence. It must however be compatible with the technique used to decrease the rear surface thickness, in particular in the case of a chemical etch.

Figure 3A:
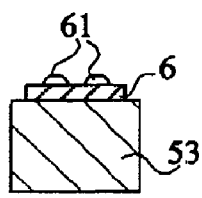
FIGS. 3A AND 3B are respective simplified cross-section and top views of a passive component chip according to an embodiment of the present invention.
Figure 3B:
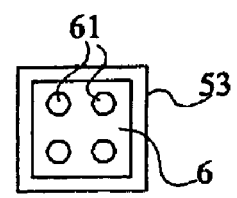

FIGS. 3A AND 3B respectively show, in cross-sectional and in top view, an example of a chip 6 of passive component(s) supported on a glass substrate 53, obtained by the implementation of a method according to an embodiment of the present invention.

An advantage of embodiments of the present invention is that it enables carrying out all the steps of manufacturing not only of the actual components but also of the small-thickness glass substrates by full wafers.

Another advantage of embodiments of the present invention is that the substrate handlings are eased due to the mechanical hold ensured by silicon wafer 1.

Another advantage of embodiments of the present invention is that its manufacturing method is compatible with the techniques conventionally used to form components on glass wafers. In particular, embodiments of the present invention are particularly well adapted to the forming of passive components (RLC) on glass substrates.

FIGS. 4A TO 4D illustrate, in cross-sectional views, steps of a method according to a second embodiment of the present invention. Certain steps are identical to those described in relation with the first embodiment and have not been shown.

It is always started (FIG. 4A) from a silicon wafer 1 or the like intended to be used as a mechanical support for the manufacturing of the components on glass substrates. However, conversely to the first embodiment, etch pattern 2' from the front surface of wafer 1 is not that of a disk but directly that desired for the individual glass substrates (53, FIG. 3) supporting the components. Thus, silicon beams 13 remain present between etched areas 2'. As in the first embodiment, the etch depth is selected to correspond to the final thickness desired for the glass substrates.

Figure 4A:
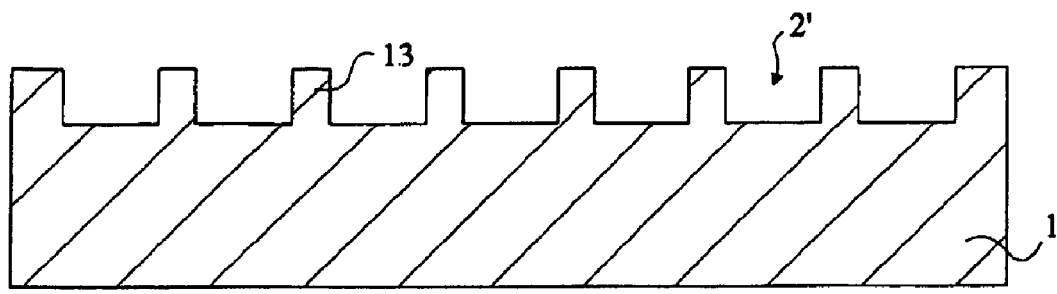
FIGS. 4A TO 4D illustrate, in simplified cross-section views, a method for manufacturing components on glass substrates according to a second embodiment of the present invention.
Figure 5A:
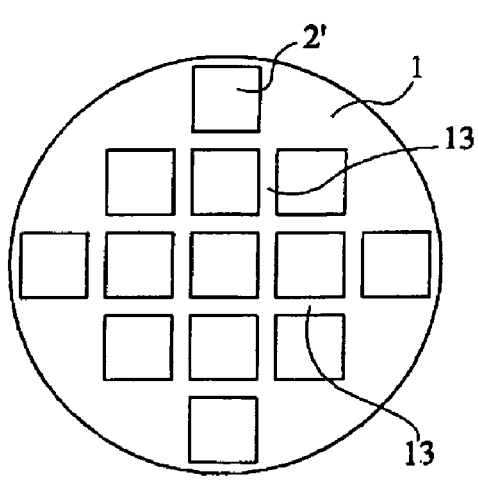
FIGS. 5A AND 5B are simplified top views of a wafer at the end of the steps of FIGS. 4A AND 4B.

FIG. 5A is a top view of silicon wafer 1 of FIG. 4A.

Glass is then deposited in patterns 2' etched in silicon wafer 1 as in the first embodiment (FIG. 1B).

Then, the front surface of the assembly is rectified to reach silicon 1 to obtain a planar surface, as in the first embodiment (FIG. 1C).

Figure 4B:
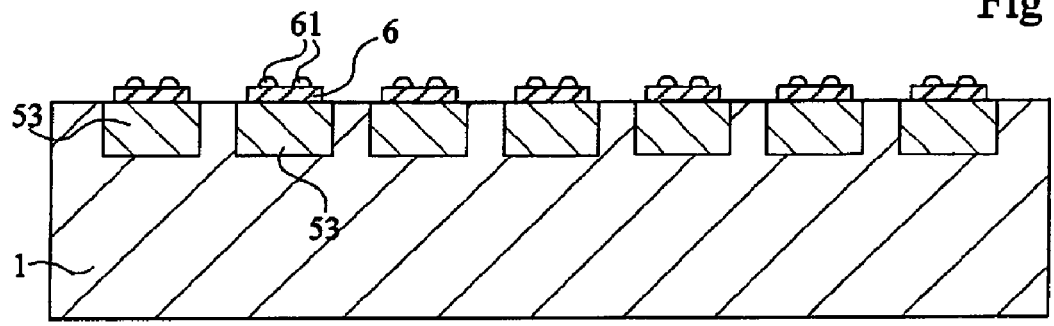

Components 6 and possibly their connection bosses 61 are then conventionally formed and a structure such as shown in FIG. 4B is obtained in which components 6, supported by individual glass substrates 53, are embedded in silicon wafer 1.

Figure 5B:
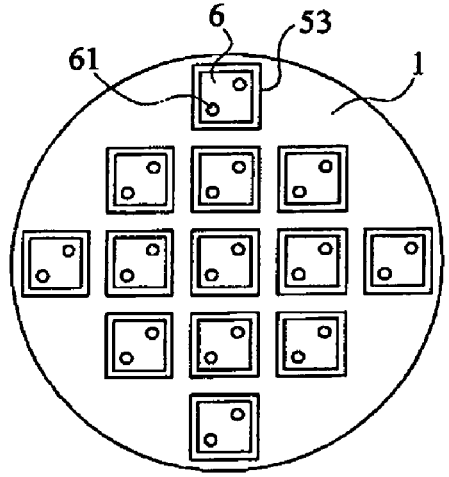

FIG. 5B is a top view of the structure obtained at the end of the component manufacturing (FIG. 4B).

As in the first embodiment (FIG. 1E), a front surface protection disk 8 is then arranged.

Figure 4C:
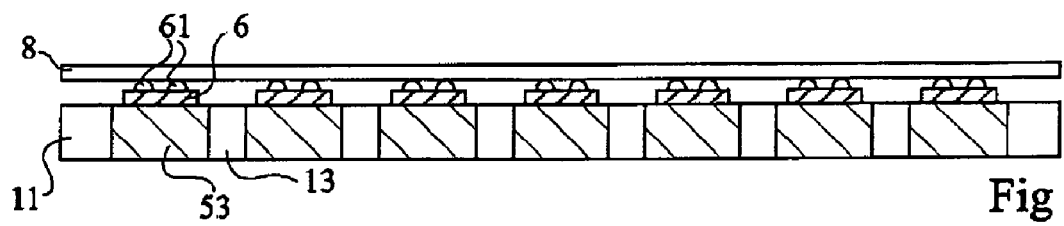

The silicon wafer 1 is then etched from its rear surface, at least to reach glass substrates 53 (FIG. 4C). There then remain around glass substrates 53 the wafer periphery as well as beams 13 separating the substrates.

Figure 4D:
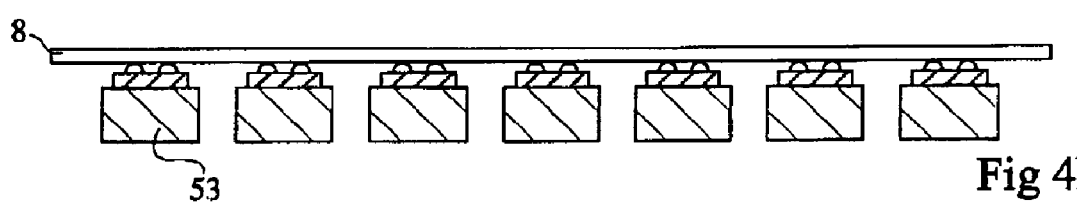

According to an embodiment of the present invention, the chemical etch of the silicon is carried on until eliminating all the silicon, and thus beams 13 and the periphery are eliminated. A structure such as illustrated in FIG. 4D where the chips 6 and conductive bosses 61 are attached by their front surfaces to protection disk 8 is then directly obtained. There then only remains to detach disk 8, as previously by using a second disk which is glued on the rear surfaces of substrates 53.

As an alternative, at the end of the silicon etch to reach the rear surface of substrates 53, the wafer is cut in paths defined by silicon beams 13. An advantage as compared to the first embodiment where the cutting is performed in the glass is that a cutting in the silicon is performed in finer fashion and with no glass splinter. This alternative of the second embodiment is used, for example, if the rear surface silicon etch is performed by rectification (grinding).

An advantage of the etching embodiment is that it suppresses any step of cutting by means of a tool of saw type or the like.

Figure 6A:
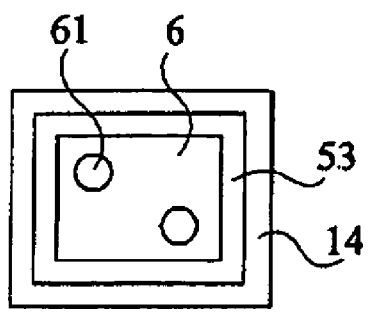
FIGS. 6A AND 6B show, respectively in top view and in cross-section view, a chip of component(s) on a glass substrate according to an alternative of the second embodiment of FIGS. 4A-4D.
Figure 6B:
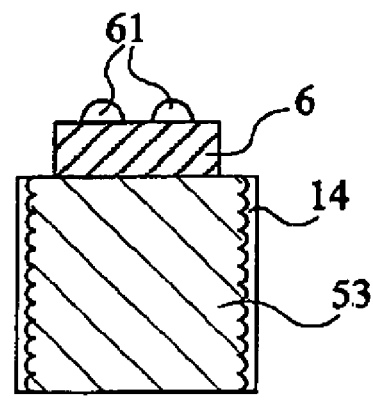

FIGS. 6A AND 6B show, respectively in top view and in cross-sectional view, a glass chip 53 supporting one or several components 6 (for example, passive components) resulting from the alternative of the second embodiment. It can be seen that glass chip 53 is surrounded with a silicon thickness 14 resulting from what remains of the cutting in wafer 1.

In cross-sectional view (FIG. 6B), the interface of separation between glass 53 and silicon 14 exhibits a scalloping which results from the method used to etch the silicon (step of FIG. 4A) which does not enable obtaining a perfect surface state. In the glass melting to form substrates 53, said glass then fills the existing roughnesses.

Figure 7A:
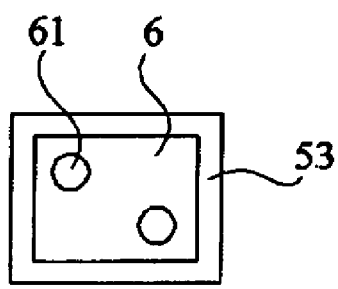
FIGS. 7A AND 7B show, respectively in top view and in cross-section view, a chip of component(s) on a glass substrate according to the second embodiment of the present invention.
Figure 7B:
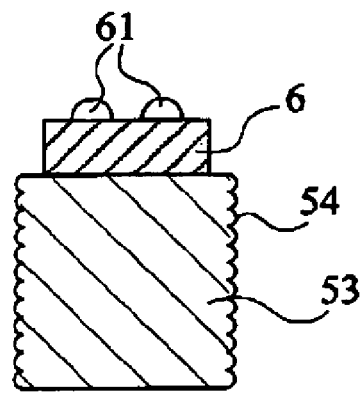

FIGS. 7A AND 7B show, respectively in top view and in cross-section view, a glass chip supporting one or several components (preferably, passive) obtained by the second embodiment of the present invention. A structure similar to that of FIGS. 6A AND 6B is found except for the fact that glass substrate 53 is not surrounded with silicon. The vertical walls of substrate 53 then directly exhibit an irregular surface state 54 resulting from the glass molding in the etched silicon patterns.

An advantage of a chemical etch of the silicon from the rear surface of wafer 1 is that the rear surface of glass chips 53 then exhibits a stripeless surface state, conversely to the grinding which creates stripes on the etched surface.

Of course, the present invention is likely to have various, alterations, improvements, and modifications which will readily occur to those skilled in the art. In particular, the adaptation of the etch thickness in the silicon wafer which depends on the final thickness desired for the glass substrate is to be performed according to the application. It should be noted that, theoretically, there is no minimum thickness. Components, especially passive, supported by very thin glass substrate (for example, of one or a few tens of micrometers) can thus be formed.

Further, the practical implementation of alternative embodiments of the present invention by using current techniques in the field of microelectronics is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The components or chips 6 formed on individual glass substrates 53 may be utilized in a variety of different types of electronic circuits. The chips 6 may include passive components such as resistors, capacitors, and inductors. These chips 6 and individual glass substrates 53 may, in turn, be utilized in communications and motor control systems, for example.

The invention claimed is:

1. A method for forming individual substrate assemblies, the method comprising:
   forming at least one cavity in a first surface of a supporting substrate, the supporting substrate having a second surface opposing the first surface;
   placing an insulating substrate material in each of the cavities to form an insulating substrate in each cavity;
   forming components on a first surface of each insulating substrate, the first surface of each insulating substrate being the surface exposed on the first surface of the supporting substrate;
   removing portions of the supporting substrate from the second surface of the supporting substrate to expose a second surface of each insulating substrate, the second surface opposing the first surface of the insulating substrate; and
   forming the individual substrate assemblies after removing portions of the supporting substrate from the second surface of the supporting substrate.

2. The method of claim 1 wherein the supporting substrate comprises a silicon substrate.

3. The method of claim 1,
   wherein a single cavity is formed in the first surface of the supporting substrate;
   wherein placing the insulating substrate in the single cavity forms a single initial insulating substrate within the cavity;
   wherein components are formed in a plurality of locations on the first surface the single initial insulating substrate;
   wherein removing portions of the supporting substrate from the second surface of the supporting substrate exposes a second surface of the initial insulating substrate opposite the first surface; and
   wherein forming the individual substrate assemblies after removing portions of the supporting substrate from the second surface of the supporting substrate comprises cutting the initial insulating substrate to form the individual substrate assemblies.

4. The method of claim 1 further comprising placing protection disk on the formed components prior to removing portions of the supporting substrate from the second surface of the supporting substrate.

5. The method of claim 1 wherein the insulating substrate material comprises glass.

6. The method of claim 1 wherein each insulating substrate has a depth of less than approximately 100 micrometers.

7. The method of claim 1,
   wherein a plurality of cavities are formed in the first surface of the supporting substrate, with beam portions of the supporting substrate defining each of the cavities;
   wherein placing the insulating substrate in the plurality of cavities forms a plurality of individual insulating substrates;
   wherein components are formed in on the first surface of each of the individual insulating substrates;
   wherein removing portions of the supporting substrate from the second surface of the supporting substrate exposes a second surface of each of the individual insulating substrates, the second surface being opposite the first surface of each individual insulating substrate.

8. The method of claim 7 wherein forming the individual substrate assemblies after removing portions of the supporting substrate from the second surface of the supporting substrate comprises cutting the beam portions of the supporting substrate to form the individual substrate assemblies.

9. The method of claim 7 wherein forming the individual substrate assemblies after removing portions of the supporting substrate from the second surface of the supporting substrate comprises etching the beam portions of the supporting substrate to form the individual substrate assemblies.

10. The method of claim 1 wherein forming at least one cavity in the first surface of the supporting substrate comprises removing portions of the supporting substrate to form each cavity.

11. The method of claim 10 wherein removing portions comprises etching the supporting substrate from the first surface of this substrate to form the cavities.

12. The method of claim 10 wherein a plurality of cavities are formed in the first surface of the supporting substrate.

13. The method of claim 10 wherein a single circular cavity is formed in the first surface of the supporting substrate.

14. A method for manufacturing electronic components on individual substrates made of an insulating material, comprising:
   molding, in a silicon wafer, an insulating material with a thickness corresponding to the final thickness desired for said individual substrates;
   manufacturing the electronic components on the insulating material; and
   removing the silicon from the rear surface of the wafer;
   wherein the operation of manufacturing electronic components comprises forming components for separate chips on respective regions of the front surface of the insulating material; and
   placing a protection disk on a front surface of the overall structure including the wafer, insulating material, and electronic components.

* * * * *

UNITED STATES PATENT AND TRADEMARK OFFICE
CERTIFICATE OF CORRECTION

PATENT NO. : 7,591,958 B2  Page 1 of 1
APPLICATION NO. : 11/213098
DATED : September 22, 2009
INVENTOR(S) : Pascal Gardes et al.

It is certified that error appears in the above-identified patent and that said Letters Patent is hereby corrected as shown below:

- In Claim 3, Column 7, Line 36, please insert the text -- of -- before the text "the single initial insulating substrate".

- In Claim 4, Column 7, Line 46, please insert the text -- a -- after the text "placing" and before the text "protection disk".

- In Claim 7, Column 8, Line 9, please insert the text -- and -- after the text "substrates;".

Signed and Sealed this

Third Day of November, 2009

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,591,958 B2 | Page 1 of 1 |
| APPLICATION NO. | : 11/213098 | |
| DATED | : September 22, 2009 | |
| INVENTOR(S) | : Gardes et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 657 days.

Signed and Sealed this

Fourteenth Day of December, 2010

David J. Kappos
*Director of the United States Patent and Trademark Office*